United States Patent [19]

Priebe

[11] Patent Number: 5,070,296
[45] Date of Patent: Dec. 3, 1991

[54] INTEGRATED CIRCUIT INTERCONNECTIONS TESTING

[75] Inventor: Gordon W. Priebe, Maple Grove, Minn.

[73] Assignee: Honeywell Inc., Minneapolis, Minn.

[21] Appl. No.: 542,455

[22] Filed: Jun. 22, 1990

[51] Int. Cl.⁵ ............................................ G01R 31/00
[52] U.S. Cl. .............................. 324/73.1; 324/158 R; 324/537; 371/15.1
[58] Field of Search .................. 324/158 R, 73.1, 500, 324/537; 371/15.1, 20.1, 22.6, 22.5; 340/653, 660

[56] References Cited

U.S. PATENT DOCUMENTS

| | | | |
|---|---|---|---|
| 3,801,905 | 4/1974 | Baker et al. | 324/74 |
| 4,395,767 | 7/1983 | Van Brunt et al. | 371/25 |
| 4,638,246 | 1/1987 | Blank et al. | 324/73 |
| 4,742,293 | 5/1988 | Koo et al. | 324/73 |
| 4,743,841 | 5/1988 | Takeuchi | 324/158 R |
| 4,791,359 | 12/1988 | Raymond et al. | 324/73 |
| 4,812,742 | 3/1989 | Abel et al. | 324/537 |
| 4,857,833 | 8/1989 | Gonzalez et al. | 324/73 |
| 4,894,605 | 1/1990 | Ringleb et al. | 324/537 |
| 4,904,883 | 2/1990 | Iino et al. | 371/22.5 |
| 4,914,379 | 4/1990 | Maeno | 371/22.5 |

Primary Examiner—Kenneth A. Wieder
Assistant Examiner—Vinh P. Nguyen
Attorney, Agent, or Firm—Theodore F. Neils

[57] ABSTRACT

A test system for determination of the integrity of interconnections between integrated circuits based on test circuit portions provided in such integrated circuits which are subject to signals from the inputs that might vary in value because of faulty interconnections. The values on such inputs are set, in the absence of input signals reaching them, by switchable resistances in the corresponding test circuit portions each of which can couple a predetermined signal value to a corresponding input, but which can also be overridden by signals supplied to that input across the corresponding interconnection from a source thereof.

20 Claims, 2 Drawing Sheets

INTEGRATED CIRCUIT INTERCONNECTIONS TESTING

BACKGROUND OF THE INVENTION

The present invention relates to testing interconnected assemblages of integrated circuits and, more particularly, to testing interconnected assemblages of integrated circuits having portions of the testing system incorporated into those integrated circuits.

The costs of providing various kinds of circuit capabilities in an integrated circuit has been decreasing rapidly. This decrease is due to a number of factors, but primarily it is because of the increase in the density of circuits which can be provided in an integrated circuit.

This decrease in costs of integrated circuits is, of course, leading to a very rapid increase in the numbers of such integrated circuits being used. One manner in which this increased use comes about is that designers of systems are taking advantage of these reduced costs to increase the capabilities of the systems they are improving with new designs, and this often means that larger numbers of such integrated circuits are being used in many kinds of upgraded systems. Of course, many entirely new kinds of systems can also be designed with these circuits in view of the reduced cost in using them.

This evolving integrated circuit situation has lead to substantial difficulties in testing such integrated circuits, and in testing such assemblages of integrated circuits, because such large densities of circuits in an integrated circuit means that larger numbers of circuit nodes are not externally available at which to conduct tests. Similarly, such large numbers of circuits in an integrated circuit lead to a larger number of input and output connections to each such integrated circuit. Thus, in assemblages of such integrated circuits, there will be a resulting large increase in the number of interconnections between the various integrated circuits mounted on a circuit board or other similar structure, and between the integrated circuits and the input and output connections on such boards or structures, all of which are usually desired to be tested.

As a result, provisions are being made for incorporating test circuits into the integrated circuits themselves and, often, additional separate test circuits are provided either on the structures upon which these integrated circuits are mounted or on a separate test structure that is interconnected to the other integrated circuit mounting structures, or both. Some test circuits incorporated into the integrated circuits are primarily concerned with setting the states of internal latches in the operating circuitry or monitoring, i.e. scanning, output states of such latches and other circuit nodes therein, such as occurs using the level sensitive scan design (LSSD) methodology. Alternatively, other test circuits are primarily involved with the setting of conditions at inputs of the operating circuits in integrated circuits and monitoring conditions at the outputs of such operating circuits in the integrated circuits, as in the boundary scan methodology.

Whatever the test circuits incorporated in an integrated circuit for testing purposes in implementing the corresponding test methodology, one difficulty which arises during testing is the occurrence of circuit faults which do not exhibit the same result during testing from one test to another. Such faults can be due to a faulty interconnection which intermittently opens and closes, or to an open interconnection having one end connected to a relatively high impedance. In this latter situation, various leakages can result in the interconnection portion connected to the relatively high impedance having a voltage change occur thereon which may more or less randomly reach one of the specified logic state voltage levels or any other value therebetween. Situations such as these lead to unreliable fault detection.

Because the circuitry provided in integrated circuits has become quite reliable, a large fraction of such failures occurs in the interconnections between chips or between chips and the edge connection of the circuit board or other structure upon which such chips are mounted, or the interconnections between such boards or structures. These interconnections include the portions thereof on the surface of the integrated circuit mounting structure all the way through the input and output terminal pads, or input and output terminal regions, in the integrated circuits. Thus, there is a desire to provide a known signal value on the input of an integrated circuit mounted on such a structure to assure test repeatability, even though the interconnection to that input may be an open circuit or an intermittently open circuit.

SUMMARY OF THE INVENTION

The present invention provides a test system for testing integrated circuits, with at least some of this testing involving determination of the integrity of the interconnections between the integrated circuits. The testing is based on test circuit portions provided in the integrated circuits being subject to receipt of signals from the integrated circuit inputs which might vary in value from test to test because of faulty interconnections between these inputs and the sources of signals to be supplied thereto. The values on such inputs are set, in the absence of input signals reaching them, by switchable resistances in the corresponding test circuit portions each of which can couple a predetermined signal value to a corresponding input, but which can also be overridden by signals supplied to that input across the corresponding interconnection from a source thereof. Such switchable resistances can be switched to a very high resistance to limit power consumption when testing is not in progress. The test circuits in integrated circuit chips can be electrically connected to one another such as in a boundary scan arrangement.

DETAILED DESCRIPTION OF THE PREFERRED EMBODIMENTS

Figure 1:
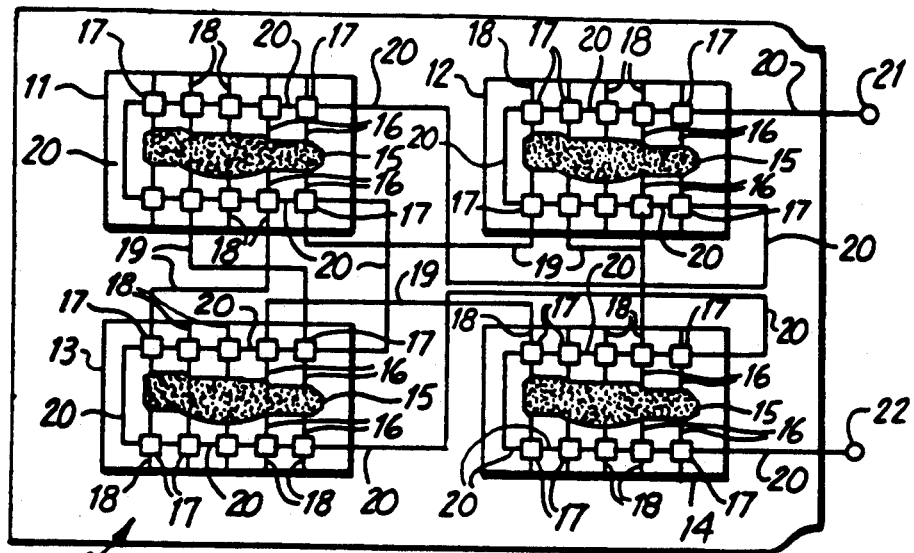
FIG. 1 shows a schematic block diagram of an assemblage of integrated circuits having incorporated test means.

FIG. 1 shows a representation of an integrated circuit mounting arrangement, 10, comprising a small printed circuit card having mounted thereon four monolithic integrated circuits, 11, 12, 13 and 14, shown merely in a representational form. Each of these monolithic integrated circuits has a set of operating circuits therein represented in each monolithic integrated circuit representation as an arbitrary form, 15, in the central area thereof with each of these forms typically differing in circuit content from one another though not necessarily so. Extending from each of circuit-containing arbitrary forms 15 are a number of interconnections, 16, which each extend out to a corresponding one of a set of blocks, 17, containing test circuits.

Each of test circuit blocks 17 is connected with one interconnection terminal or terminal region, 18, of integrated circuits 11, 12, 13 and 14. Some of these interconnection terminals have interconnections, 19, extending from them to other such interconnection terminals in other ones of the integrated circuits on the printed circuit card so that signals can be transmitted directly between these integrated circuits.

Finally, each of test circuit blocks 17 is connected in series with the remaining ones of these blocks in an interconnection series string through having another set of interconnections, 20, joining the members of this series string. The ends of this series string are shown brought out to the right-hand edge of the integrated circuit card to a pair of board terminals, 21 and 22.

FIG. 1 thus depicts one kind of arrangement for providing test circuits incorporated into monolithic integrated circuits, this test arrangement often being termed a "boundary scan" test arrangement. Data can be transferred from terminal 21 to terminal 22 by passing through all of the test circuit blocks 17. Of course, data can be inserted in any of test blocks 17 by a sufficient shifting of that data along conductors 20 and through those test circuit blocks 17 preceding it until that data reaches the selected one of those blocks. Similarly, data can be retrieved from any of test blocks 17 by a sufficient shifting of that data along conductors 20 and through those test circuit blocks 17 following it until that data reaches one of terminals 21 or 22.

This arrangement permits placing data delivered in this manner to the corresponding ones of test blocks 17 on those of interconnections 16 which are signal inputs for any of circuits 15, and to then be transferred into those circuits. In addition, this arrangement allows for having any of circuits 15 place output data therefrom onto corresponding output ones of interconnections 16 to result in that data being transmitted into the corresponding ones of test circuit blocks 17 from where it can be shifted out to one of terminals 21 or 22. As a result, test signals can be inserted into appropriate ones of test circuit blocks 17 to be introduced into operating circuits 15 at inputs thereof, and the results received at the outputs of operating circuits 15 to be captured in the corresponding ones of test circuit blocks 17 connected to these outputs. Hence, input data can be transferred into the various integrated circuits between terminals 21 and 22 at inputs thereof, and the results can be collected at outputs thereof to be shifted out to one of terminals 21 and 22.

In addition, any of test blocks 17 corresponding to outputs in the various integrated circuits can also be arranged to have test data shifted thereto from one of terminals 21 and 22 to thereby provide this data at corresponding output interconnection terminals 18 thereof. Such data provided on these output interconnection terminals 18 is then transmitted over interconnections 19 to be received as inputs at other integrated circuit interconnection terminals 18 serving as input terminals therefor. In this manner, interconnections 19 can be checked for faults which would prevent transmission of data thereacross.

If interconnections 19 have open circuits occurring in them, whether continually or intermittently, testing as described in the foregoing paragraph can result in varying responses in later repeated tests if the input of an integrated circuit to which an interconnection 19 is connected has a high impedance. This is typically the situation at the inputs of monolithic integrated circuits based on complementary metal-oxide-semiconductor (CMOS) field-effect transistor (FET) technology. In such instances, the integrated circuit inputs and the portion of the interconnection 19 connected thereto on its side of the open circuit can drift to any of a wide range of voltages, including those voltage levels associated with the "0" and "1" logic states in the digital circuitry connected thereto or any voltage level therebetween. Testing results with such conditions present can vary significantly from test to test, leading to significant difficulty in interpreting such results.

Figure 2:
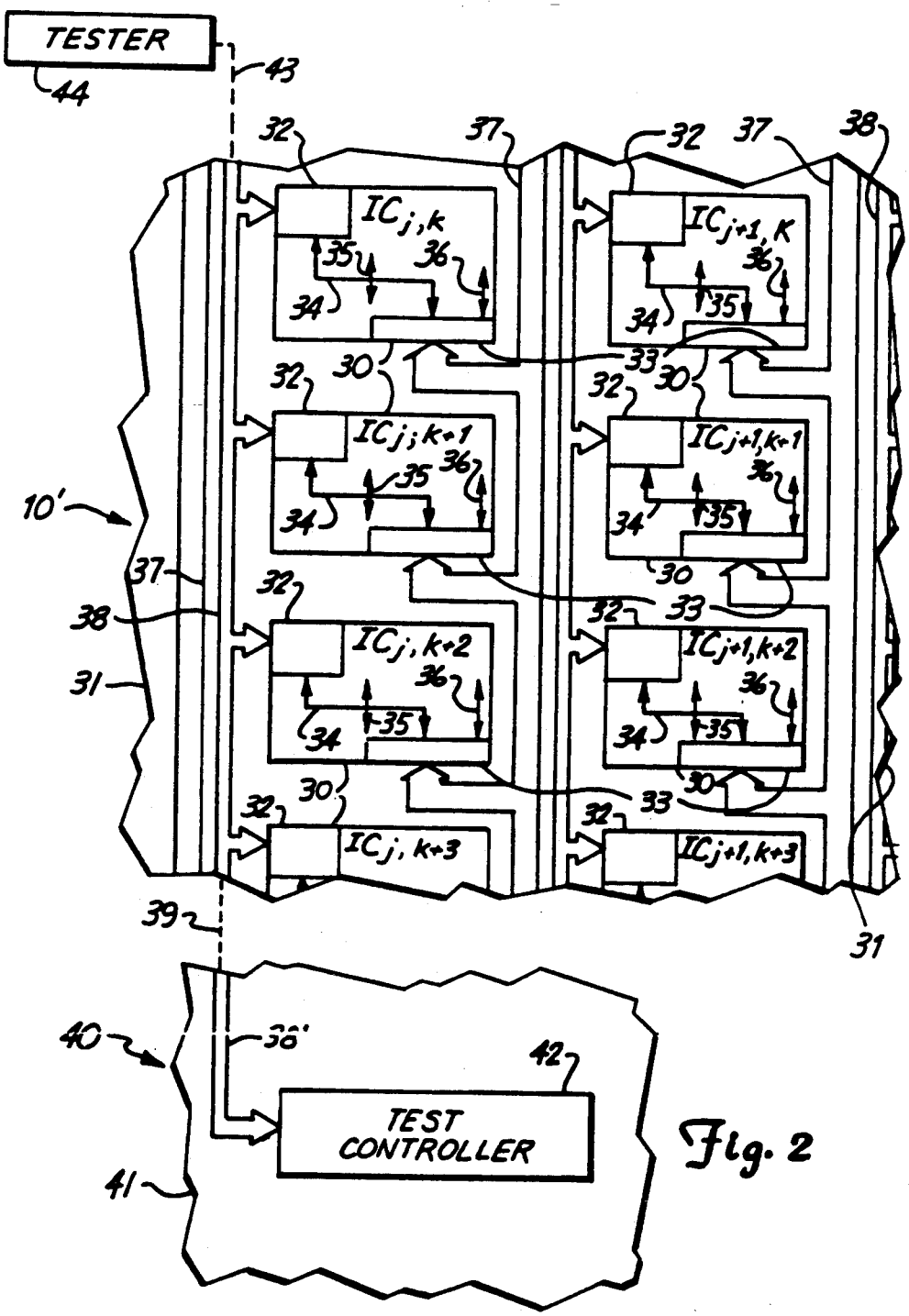
FIG. 2 shows an alternative block diagram of a system like that of FIG. 1.

A portion of a representation of an alternative integrated circuit mounting arrangement, 10', is shown in FIG. 2 with a more typical interconnection scheme for larger assemblages of integrated circuits based on buses as opposed to the less ordered interconnection scheme shown in FIG. 1. Integrated circuit mounting arrangement 10' comprises a number of integrated circuits, 30, mounted on a substrate, 31, formed of a printed circuit card, ceramic layers composite, or the like. Integrated circuits 30 are shown as having an individual designation based on a two-dimensional indexing notation, $IC_{x,y}$.

Rather than having an arbitrary form in the interior to designate the operating circuits therein, as was used in FIG. 1, integrated circuits 30 are represented as having internal operating circuits everywhere outside of two rectangular forms set out therein. One of these rectangular forms, 32, shown in the upper left-hand corner of each of the representations of integrated circuit 30, is provided to show the portion of the integrated circuit given over to most of the test circuits, and to the control circuits therefor, which are incorporated into that integrated circuit to form an on-chip monitor system. The second rectangular form, 33, in each of the integrated circuits 30 represents the fraction of the integrated circuit given over to the input and output terminal arrangements for that integrated circuit. Through these terminal arrangements the integrated circuit receives system operating signals from external sources at those of the terminal arrangements which are input terminals, and provides signals to other external system components from those of its terminal arrangements which are output terminals. Each of the input/output terminal arrangements contained in block 33 also have a corresponding one of test circuit blocks 17 of FIG. 1 contained therein as a further part of the on-chip monitor system.

These input/output terminal arrangements in each integrated circuit 30 are connected by an integrated circuit internal interconnection bus, 34, therein to the corresponding on-chip monitor system circuit contained in block 32 thereof, and also to the operating circuits in the integrated circuit through an extension of the internal interconnection bus as indicated by arrows, 35. In addition, input/output terminal arrangements of block 33 in each integrated circuit 30 are also connected directly to the operating circuits in the remaining portions thereof as represented by further interconnection arrows, 36. An operating circuit bus, 37, interconnects the various input/output terminal arrangements 33 of each integrated circuit 30 to selected ones of the input/output terminal arrangements in the others to thus provide the same capabilities as are provided by interconnections 19 of FIG. 1.

A further bus arrangement, 38, interconnects the on-chip monitor test circuit blocks 32 of each of the integrated circuits 30. This bus thus provides capabilities similar to those provided by interconnections 20 in FIG. 1. Further, bus 38 connects the integrated circuit mounting arrangement 10' with external sources of test signals which are brought into arrangement 10' for controlling and performing both local tests in integrated circuits 30 and system level tests involving these integrated circuits.

At least two alternatives are possible and shown in FIG. 2, the first of these being a set of interconnections, 39, connecting bus 38 to a further integrated circuit mounting arrangement, 40, formed on another electronic system substrate, 41, upon which is provided an extension, 38', of test bus 38 shown in arrangement 10'. Edge connectors on substrates 31 and 41 connect buses 38 and 38' to interconnections 39. Extension bus 38' is connected to a test controller, 42, which provides both the control signals and the test data signals which are used in testing integrated circuits 30 on substrate 31.

Alternatively, bus 38 may be brought to the edge of substrate 31 and there an edge connector provides a connection to a further, or alternative, set of interconnections, 43, leading to an automatic system tester, 44. Again, tester 44 provides the control signals and the test data signals which are used in testing integrated circuits 30 on substrate 31. Either or both of these sources of external test signals and control signals, that is test controller 42 or automatic tester 44, can be used in providing tests for integrated circuits 30 and the interconnections therebetween provided on substrate 31.

Figure 3:
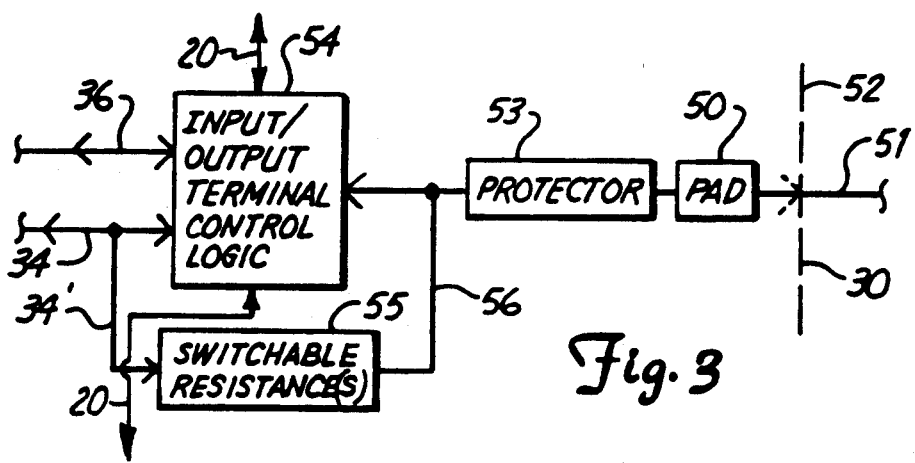
FIG. 3 shows a block diagram of a portion of FIG. 2.

FIG. 3 shows a block diagram of one of the input/output terminal arrangements occurring in a block 33 of one of integrated circuits 30. FIG. 3 will be described as representing an input terminal arrangement, but the input/output terminal arrangements of a block 33 could also include output terminal arrangements and combined input and output terminal arrangements. An external interconnection conductive area, or pad, 50, is formed on the integrated circuit chip to receive an external interconnection coupling means such as a thermocompression bonded wire or a solder ball (not shown). An interconnection, 51, is provided extending past a vertical line, 52, representing the edge of the integrated circuit chip, to external circuitry and includes such an external interconnection coupling means as well as the packaging interconnection portion such as a pin or surface mount conductor and the like.

Interconnection 51 also provides a conductive path so that input signals can be brought into the input/output terminal arrangement from those external circuits. In addition, the input/output terminal arrangement of FIG. 3, though to be described below primarily as an input terminal arrangement, could also be one which could provide output signals over the same interconnections to such external circuits, and so a dashed line arrow is shown, at dashed line 52 at the edge of integrated circuit 30, pointing toward, the external circuits. A protection circuit, 53, is provided between pad 50 and the circuits in the integrated circuit to limit voltage excursions permitted on the interconnection therefrom to the interior operating circuits of the integrated circuit 30 to protect that circuitry from the risks of unduly large voltages.

Externally supplied signals passing through protection circuitry 53, to be transmitted to either the test circuits for test purposes or the operating circuits for signal processing purposes, or both, first arrives at an input/output terminal control logic arrangement, 54. This arrangement is shown in FIG. 3 having on its left a bus interconnection corresponding to that shown in FIG. 2, internal test bus 34 to the on-chip monitor system, and interconnections 36 to the operating circuits in the remainder of that integrated circuit 30. In addition, interconnections 20 to other input/output terminal arrangements are shown which were not shown in the input/output terminal arrangements in the blocks 33 of FIG. 2, although they were shown in FIG. 1.

Input/output terminal control logic arrangement 54 contains test block circuits with capabilities like those of test block circuit 17 in FIG. 1, and have therein a register to capture portions of an input signal provided on interconnection 51. This register in control logic 54 may also have signals introduced therein, and transmitted therefrom, by way of internal test bus 34 from the remaining portions of the on-chip monitor system in block 32 of that integrated circuit to be applied to, or received from, the operating circuits of that integrated circuit for test purposes. Such may also be transmitted and received over interconnections 20.

Output signals from the operating circuits to external circuits are transmitted from control logic 54 through protection circuit 53 to pad 50 and then to the external circuits if this control logic is also capable of being an output terminal arrangement. A test circuit register in control logic 54 can capture a portion of these output signals or can receive signals on bus 34 for transmission to the external circuits.

If integrated circuits 30 are fabricated based on CMOS field-effect transistor technology, input signals provided on the conductive path from interconnection 51 through pad 50 and protection circuitry 53 to control logic 54 face a high input impedance in control logic 54. Thus, again, if there is any interruption in the continuity of interconnection 51, or the path from pad 50 to control logic 54, the voltage occurring on this conductive path between the interruption and the input of control logic 54 can drift to any of a substantial range of voltages including those voltage levels associated with a "0" or a "1" logic state for digital circuitry. The voltages actually reached can vary from test to test, or from tests at one time to those at another time, giving test results which, as indicated above, can be difficult to interpret. Thus, a block, 55, is provided with switchable resistances as part of the test circuits of control logic 54, but shown separately in FIG. 3, to give the inputs of control logic 54 a selected voltage value, and so a selected logic state in digital circuitry, until overridden by input voltage signals on interconnection 51 supplied by external circuitry.

The switchable resistances of block 55 are controlled by a signal along internal test bus 34 which is shown to have a branching portion, 34', directed to switchable resistances of block 55. The output of the switchable resistances of block 55 has an interconnection, 56, connected to the interconnection conductor formed by interconnection 51 extending through pad 50 and protection circuit 53 to the input of control logic 54 which, in a CMOS technology based integrated circuit, would be formed by the gate of a field-effect transistor. In an integrated circuit 30, this conductor formed by pad 50 and the interconnection therefrom extending through to the input of control logic 54 would be formed by a certain region of that integrated circuit serving as its input.

Figure 4:
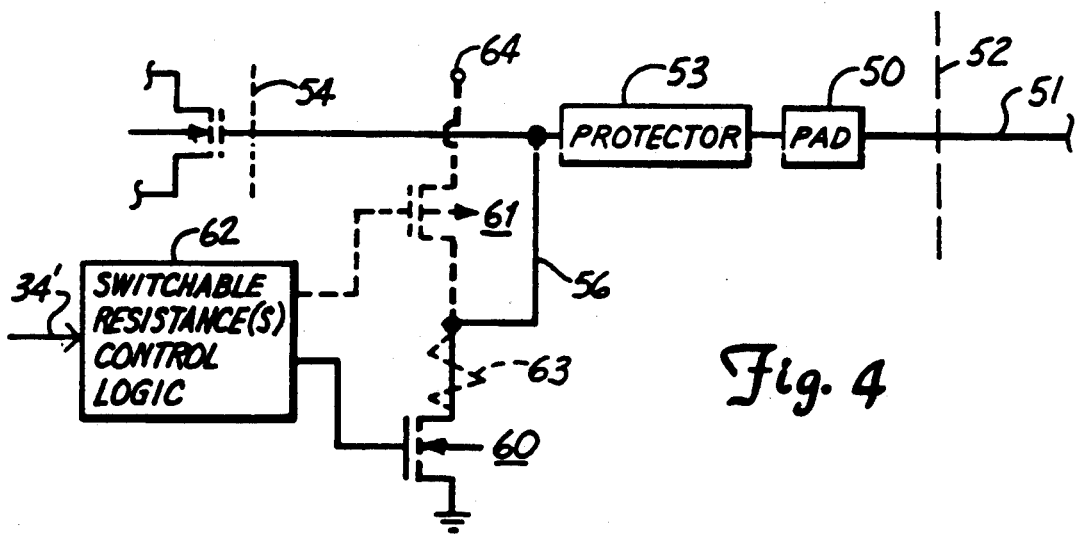
FIG. 4 shows a block and circuit schematic diagram of a portion of FIG. 3.

FIG. 4 shows this input region in some more detail, and shows more of the details of the switchable resistances in block 55 of FIG. 3. A conductor extending from the external interconnection 51 through pad 50 and protection circuit 53 to the input of control logic 54, the edge of which is represented as a dashed line in FIG. 4, can be seen to terminate on the gate of an n-channel field-effect transistor which is all that is shown of control logic 54. (If control logic 54 also is selected to be capable of providing output signals, this input conductor would also have field-effect transistor drains connected thereto.) Interconnection 56 extends from this conductor to the drains of a pair of field-effect transistors, 60 and 61.

Internal circuit bus branching portion 34' is provided to a switchable resistance control logic arrangement, 62, which controls the gates of field-effect transistors 60 and 61. Typically, switchable resistance control logic arrangement 62 need control only a single transistor, either field-effect transistor 60 or field-effect transistor 61, rather than both since a single voltage level representing a single logic state is all that is desired to be introduced on the conductor extending between interconnection 51 and the input of control logic 54. In FIG. 4, therefore, field-effect transistor 60 has been drawn in solid lines as the primary example of a transistor being controlled by switchable resistance control block logic arrangement 62.

During the operation of the system to accomplish its desired function, input signals from external interconnection 51 are provided on the conductor to the input of control logic 54 to be operated upon by the operating circuits in integrated circuit 30. Switchable resistance control logic arrangement 62 keeps transistor 60 in the "off" condition so that there is an open circuit between the ground reference to which the source of transistor 60 is connected and both the drain of that transistor and the conductor to which interconnection 56 is connected.

However, for at least some circuit tests, a signal on internal test bus branch 34' leads to switchable resistance control logic arrangement 62 switching transistor 60 into the "on" condition. The length-to-width of transistor 60 is chosen so that transistor 60 in that condition has a selected effective resistance value which is thereby connected between the conductor to which interconnection 56 is connected and the ground reference to which the source of transistor 60 is connected. Typically, this puts a "0" logic state on the input of control logic 54. However, the resistance of transistor 60 is sufficient so that voltage input signals on external interconnection 51 are capable of raising the input of control logic 54 to a voltage level representing the "1" logic state. Of course, field-effect transistor 60 can alternatively be designed as an ordinary switching transistor and instead have a resistance, 63, shown in dashed lines, placed in series between its drain and interconnection 56 to achieve the same results.

Either alternatively to, or in conjunction with, field-effect transistor 60, field-effect transistor 61 can be provided with its drain connected to interconnection 56 and its source connected to a source of relatively positive voltage through it being provided at a terminal, 64, in FIG. 4. Again, during operation of the corresponding integrated circuit 30 in normal signal processing, transistor 61 will be in the "off" condition. In at least some test situations, however, a resistance can be placed between terminal 64 and interconnection 56 by switching transistor 61 into the "on" condition which again can be of a suitable value through choosing its length-to-width ratio appropriately. In this condition, a "1" logic state will typically be provided through interconnection 56 on the input of control logic 54. Again, externally supplied input voltage signals on interconnection 51 will be sufficient to override the signal introduced by transistor 61 so that the input of control logic 54 can be forced into the "0" state by these signals if so desired. If interconnection 51 is open, or some portion of the conductor between there and the connection of interconnection 56 is open, a fixed logic state will again thereby be introduced at the input of control logic 54.

During normal signal processing operation of the system, transistor 61 will be in the "off" condition and so draw no power which would otherwise be wasted. Similarly, in such normal operation, transistor 60 will be in the "off" condition and so drain no power from the input of control logic 54. In the situation where a large number of input/output terminal arrangements in block 32 of integrated circuit 30 occurs, a cumulative drain of power could result if, for instance, a fixed resistance was connected between terminal 64 and the input of control logic 54. This power drain can be a significant detriment which is avoided by having the resistances being switchably provided, as opposed to being permanently provided, between one of the voltage sources and the conductor extending from interconnection 51 to the input of control logic 54. Of course, the use of switchable resistances permits two of them to be present so that either logic state can be placed on this conductor which would not be achievable using two permanent resistances in place thereof.

Although the present invention has been described with reference to preferred embodiments, workers skilled in the art will recognize that changes may be made in form and detail without departing from the spirit and scope of the invention.

What is claimed is:

1. A test system for testing interconnections extending at least in part along a surface of a structure to one or more integrated circuits mounted on that structure, said test system comprising:

a first integrated circuit mounted on said structure with a first said interconnection extending to a first input signal region therein, said first integrated circuit having both operating circuits and test circuits contained therein electrically connected to said first input signal region with at least a first portion of said test circuits being capable of being selected by control signals provided at a control signal region in said first integrated circuit to retain therein at least temporarily one or more portions of input signals provided at said first input signal region, said test circuits further being capable of providing response signals at least at one output signal region of said first integrated circuit in response to input signals retained in said test circuits first portion from said first input signal region, said test circuits first portion having therein a switchable resistance means electrically connected between said first input signal region and a first selected source of voltage and being additionally capable, if selected, of switching said switchable resistance means from being substantially an open circuit between said first input signal region and said first selected source of voltage to providing a selected resistance value therebetween in response to said control signals;

a test control signal source means electrically connected to said first integrated circuit control signal region and capable of providing selected control signals thereto to cause said test circuits first portion resistance means to switch between providing a substantially open circuit and providing a selected resistance value between said first input signal region and said first selected source of voltage;

a test signal source means electrically connected to said first interconnection at a location differing from that at which said first interconnection is connected to said first integrated circuit first input signal region, said test signal source means being capable of providing selected test signals on said first interconnection; and a test response receipt means electrically connected to said first integrated circuit output signal region to receive said response signals.

2. The apparatus of claim 1 wherein said selected test signals supplied by said test signal source means are voltage signals, and wherein said test circuits first portion, if selected and directed by said control signals to switch said switchable resistance means therein to provide said selected resistance value between said first integrated circuit first input signal region and said first selected source of voltage, provides a sufficient resistance value so that voltage levels on said first interconnection will substantially equal those voltage levels present in said selected test signals as provided by said test signal source means if said first interconnection extends without interruption between said test signal source means and said first integrated circuit first input signal region.

3. The apparatus of claim 2 wherein said test circuits first portion resistance means comprises a resistance of said sufficient resistance value in series with a transistor switch.

4. The apparatus of claim 2 wherein said test circuits first portion resistance means comprises a CMOS field-effect transistor with a length-to-width ratio selected to provide said sufficient resistance value between its drain and source if said transistor is in an "on" condition.

5. The apparatus of claim 1 wherein said first integrated circuit has a second signal input region therein with a second said interconnection extending thereto, said test circuits having a second portion thereof which is capable of being selected by said control signals provided at said control signal region in said first integrated circuit to retain therein at least temporarily one or more portions of input signals provided at said second input signal region, said test circuits second portion having therein a switchable resistance means electrically connected between said second input signal region and a second selected source of voltage and being additionally capable, if selected, of switching said switchable resistance means from being substantially an open circuit between said second input signal region and said second selected source of voltage to providing a selected resistance value therebetween in response to said control signals, and wherein said test control signal source means is capable of providing selected control signals which will cause said test circuits second portion resistance means to switch between providing a substantially open circuit and providing a selected resistance value between said second input signal region and said second selected source of voltage, and wherein further said test signal source means is electrically connected to said second interconnection at a location differing from that at which said second interconnection is connected to said first integrated circuit second input signal region, said test signal source means being capable of providing selected test signals on said second interconnection.

6. The apparatus of claim 5 wherein said selected test signals supplied by said test signal source means are voltage signals, and wherein said test circuits second portion, if selected and directed by said control signals to switch said switchable resistance means therein to provide said selected resistance value between said first integrated circuit second input signal region and said second selected source of voltage, provides a sufficient resistance value so that voltage levels on said second interconnection will substantially equal those voltage levels present in said selected test signals as provided by said test signal source means if said second interconnection extends without interruption between said test signal source means and said first integrated circuit second input signal region.

7. The apparatus of claim 6 wherein said test circuits second portion resistance means comprises a resistance of said sufficient resistance value in series with a transistor switch.

8. The apparatus of claim 6 wherein said test circuits second portion resistance means comprises a CMOS field-effect transistor with a length-to-width ratio selected to provide said sufficient resistance value between its drain and source if said transistor is in an "on" condition.

9. The apparatus of claim 1 wherein said test signal source means comprises a second integrated circuit mounted on said structure and having an output signal region electrically connected to said first interconnection, said second integrated circuit having both operating circuits and test circuits therein with a first portion of said test circuits being capable of being selected by control signals provided at a control input signal region of said second integrated circuit to provide output signals on said second integrated circuit output signal region.

10. The apparatus of claim 9 wherein said output signals which are provided on said second integrated circuit output signal region are representative of signals supplied to said second integrated circuit test circuits at a test signal region connected thereto.

11. The apparatus of claim 9 wherein said first integrated circuit test circuits are electrically connected to said second integrated circuit test circuits between a test signal region in each thereby permitting signals to be transferred from said second integrated circuit test circuits to said first integrated circuit test circuits first portion while avoiding use of said first interconnection.

12. The apparatus of claim 11 wherein said test signal regions of said first and second integrated circuits are electrically connected by a second said interconnection extending along a surface of said structure.

13. The apparatus of claim 9 wherein said test signal source means further comprises an external test signal source which is electrically connected to a second interconnection extending along a surface of said structure to a signal receiving region of said second integrated circuit.

14. The apparatus of claim 1 wherein said test signal source means comprises an external test signal source which is capable of being electrically connected to said first interconnection at a location other than that where said first interconnection is electrically connected to said first integrated circuit input signal region.

15. The apparatus of claim 1 wherein said test control signal source means comprises a second integrated circuit mounted on said structure and having an output signal region electrically connected to said first integrated circuit control signal region.

16. The apparatus of claim 15 wherein said test control signal source means further comprises an external control signal source which is electrically connected to a second interconnection extending along a surface of said structure to a control signal region of said second integrated circuit.

17. The apparatus of claim 15 wherein said second integrated circuit has both operating circuits and test circuits therein with a first portion of said test circuits being capable of being selected by control signals provided at a control input signal region of said second integrated circuit to provide output signals on said second integrated circuit output signal region.

18. The apparatus of claim 17 wherein said test control signal source means further comprises an external control signal source which is electrically connected to a second said interconnection extending along a surface of said structure to said control signal region of said second integrated circuit.

19. The apparatus of claim 15 wherein said second integrated circuit output signal region is electrically connected to said first integrated circuit control signal region by a second said interconnection extending along a surface of said structure.

20. The apparatus of claim 1 wherein said test control signal source means comprises an external control signal source which is electrically connected to a second said interconnection extending along a surface of said structure to said control signal region of said first integrated circuit.

* * * * *